(12) United States Patent
Tanaka

(10) Patent No.: US 8,837,548 B2
(45) Date of Patent: Sep. 16, 2014

(54) SEMICONDUCTOR OPTICAL ELEMENT

(71) Applicant: Fujitsu Limited, Kawasaki (JP)

(72) Inventor: Shinsuke Tanaka, Hiratsuka (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/156,561

(22) Filed: Jan. 16, 2014

(65) Prior Publication Data

US 2014/0133511 A1   May 15, 2014

Related U.S. Application Data

(63) Continuation of application No. PCT/JP2011/004525, filed on Aug. 10, 2011.

(51) Int. Cl.
| | |
|---|---|
| H01S 5/00 | (2006.01) |
| H01S 5/125 | (2006.01) |
| H01S 5/0687 | (2006.01) |
| H01S 5/10 | (2006.01) |
| H01S 5/14 | (2006.01) |

(52) U.S. Cl.
CPC ............... *H01S 5/125* (2013.01); *H01S 5/1007* (2013.01); *H01S 5/141* (2013.01); *H01S 5/1032* (2013.01); *H01S 5/0687* (2013.01); *H01S 5/142* (2013.01)
USPC ...................................................... 372/50.11

(58) Field of Classification Search
CPC ......... H01S 5/125; H01S 5/068; H01S 5/141; H01S 5/1032
USPC ...................................................... 372/50.11
See application file for complete search history.

(56) References Cited

U.S. PATENT DOCUMENTS

| | | | | |
|---|---|---|---|---|
| 6,605,228 | B1 * | 8/2003 | Kawaguchi et al. | ............ 216/24 |
| 2003/0091289 | A1 * | 5/2003 | Saito et al. | ............ 385/49 |
| 2005/0018951 | A1 * | 1/2005 | Mossberg et al. | ............ 385/14 |
| 2006/0198416 | A1 | 9/2006 | Yamazaki | |
| 2007/0223939 | A1 | 9/2007 | Arimoto | |
| 2009/0092159 | A1 | 4/2009 | Kato | |
| 2009/0285251 | A1 | 11/2009 | Yamazaki | |

FOREIGN PATENT DOCUMENTS

| | | |
|---|---|---|
| JP | 2001-111161 A | 4/2001 |
| JP | 2001-156364 A | 6/2001 |

(Continued)

OTHER PUBLICATIONS

International Search Report, mailed in connection with PCT/JP2011/004525 and mailed Sep. 20, 2011.

*Primary Examiner* — Tuan Nguyen
(74) *Attorney, Agent, or Firm* — Fujitsu Patent Center

(57) ABSTRACT

Two or more first reflectors are formed on a substrate. Each of the first reflectors reflects the light input to its input port and returns it there, while exhibiting a reflection spectrum featuring a peak at the target wavelength. A first optical coupler is formed on the substrate to divide the light output from an optical amplifier and output the divided lights to the input ports of the two or more first reflectors, as well as combining the reflected lights from the first reflector and re-inputting the combined light to the optical amplifier. Each of the first reflectors contains a ring resonator of the same size, and the delay for the light input to the input port of a first reflector to return there after being reflected is the same for all first reflectors.

9 Claims, 12 Drawing Sheets

(56) References Cited

FOREIGN PATENT DOCUMENTS

| | | |
|---|---|---|
| JP | 2002-57412 A | 2/2002 |
| JP | 2004-157192 A | 6/2004 |
| JP | 2006-245344 A | 9/2006 |
| JP | 2007-256716 A | 10/2007 |
| JP | 2009-59729 A | 3/2009 |
| JP | 2009-278015 A | 11/2009 |
| JP | 2010-27664 A | 2/2010 |
| JP | 2010-50162 A | 3/2010 |
| JP | 2010-177539 A | 8/2010 |

* cited by examiner

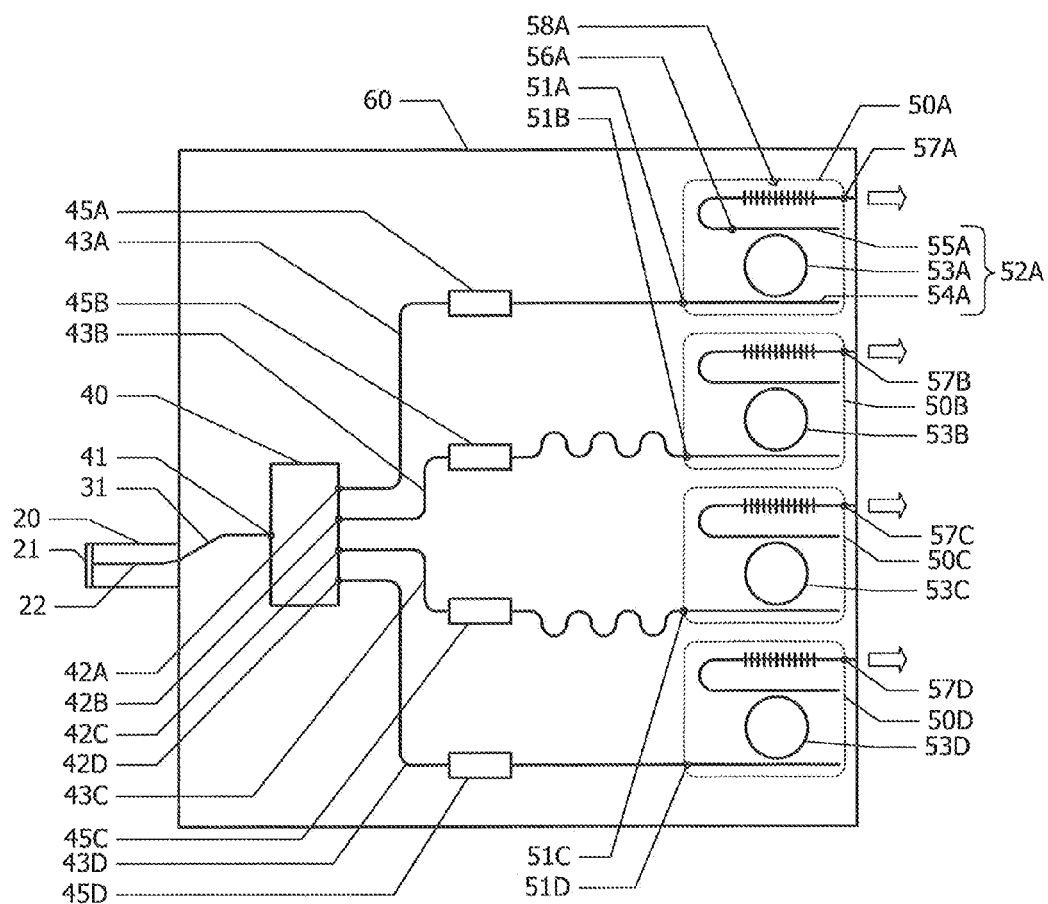

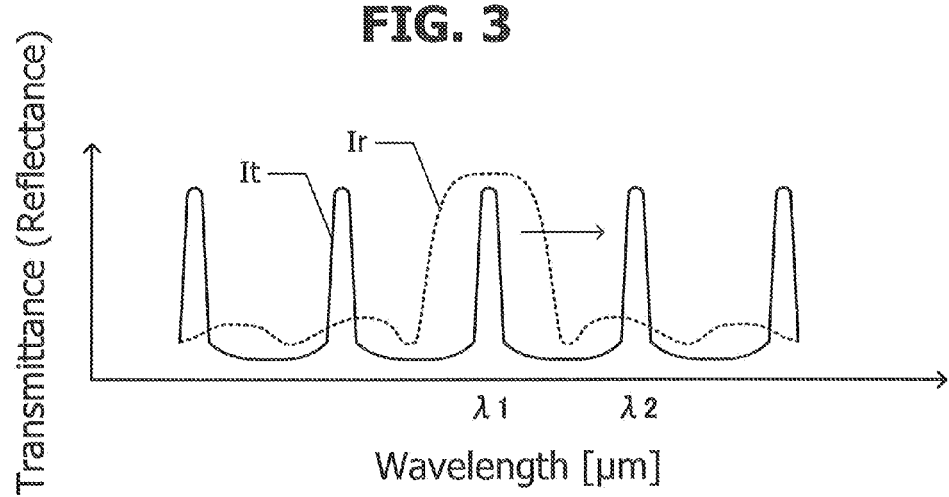

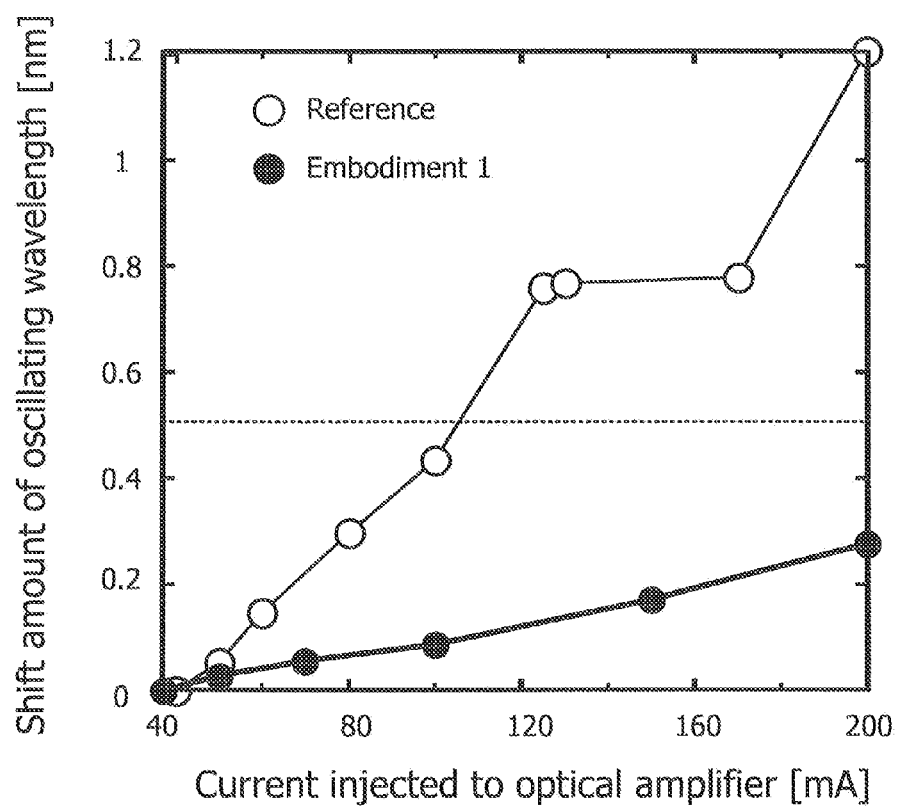

SEMICONDUCTOR OPTICAL ELEMENT

CROSS REFERENCE TO RELATED APPLICATION

This application is a continuation application of International Patent application PCT/JP2011/004525, filed in Japan on Aug. 10, 2011, the whole contents of which are incorporated herein by reference.

FIELD

The embodiments discussed herein relate to a semiconductor optical element including ring resonators.

BACKGROUND

In recent years, a technique to form optical functional elements on a silicon substrate cheaply by utilising silicon electronic circuit technology capable of large-scale integration has become a focus of attention. Amid improvements in the performance of information processing machinery and equipment, ranging from high-performance servers and supercomputers all the way down to personal computers, there is concern over the capacity bottleneck of communication between chips and boards. As a technique to solve this problem of a communication capacity bottleneck, hopes are pinned on the realization of compact low-loss optical elements on silicon substrates using silicon wire waveguides.

To realize a large-scale optical element on a silicon substrate, there is a need for a light source that provides the optical element with a signal light. However, as an indirect gap semiconductor, silicon is not suited for the implementation of a high-efficiency light source. As a technique to solve the problem of a communication capacity bottleneck, the realization of a hybrid-integrated laser source comprising a high luminous-efficiency light source based on InP, GaAs or some other semiconductor compound and optical elements provided on a silicon substrate is regarded as promising.

For instance, an optical element comprising two or more ring resonators that is designed to strictly control the oscillation wavelength by taking advantage of the Vernier effect of the resonant wavelengths of the ring resonators has been proposed. An optical element featuring a wavelength filter configured by cascade-connecting three ring resonators and a ring resonator-type light modulator has also been proposed.
Patent Document 1 Japanese Laid-open Patent Publication No. 2006-245344
Patent Document 2 Japanese Laid-open Patent Publication No. 2010-027664

SUMMARY

In the case of an optical element taking advantage of the Vernier effect of the resonant wavelengths of two or more ring resonators, the light output intensity fluctuates widely when the resonant wavelength of each ring resonator changes due to temperature changes. Similarly, an optical element featuring a wavelength filter comprising three ring resonators is susceptible to light output fluctuations as a result of fluctuations in the resonant wavelengths of the ring resonators due to temperature changes.

Even when the ambient temperature is kept constant, the resonant wavelengths sometimes change as the light output of the light amplifier is increased. In the embodiments described below, semiconductor optical elements that are relatively immune to changes in resonant wavelength even if the light output of the light amplifier is increased are realized.

There is provided a semiconductor optical element comprising:
an optical amplifier;
a plurality of first reflectors, formed on a substrate, that reflect lights input from their respective input ports, return them to the input ports, and exhibit a reflection spectrum featuring a peak at a target wavelength;
a first optical coupler, formed on the substrate, that divides light output from the optical amplifier and inputs the divided lights to the input ports of the plurality of first reflectors, combines the lights reflected from the plurality of first reflectors, and re-inputs them to the optical amplifier; and
a second reflector that, together with each of the first reflectors, defines an optical resonator containing the optical amplifier and optical coupler;
wherein each of the first reflectors contains a ring resonator of the same size and the delay time for the light input from the input port to return there after being reflected is the same for all first reflectors.

The light output from a light amplifier is divided and distributed to two or more first reflectors. This ensures that, even if the power of the light output from the light amplifier increases, the power of the light input to each of the first reflectors does not increase nearly as much. As a result, changes in the resonant wavelengths of the ring resonators built into the first reflectors can be limited.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF THE DRAWINGS

FIG. 1 is a plan view of the semiconductor optical element in Embodiment 1.

FIG. 2A is a cross-sectional view of an optical waveguide on the substrate, while

FIG. 3 is a graph showing the transmission spectrum of a ring resonator and the reflection spectrum of a distributed Bragg reflector.

FIG. 4 is a graph showing measurement results that illustrate the relationship between the input electric current to the optical amplifier and the amount of shift in oscillation wavelength through a cross-comparison of Embodiment 1 and the reference.

DESCRIPTION OF EMBODIMENTS

Figure 10:
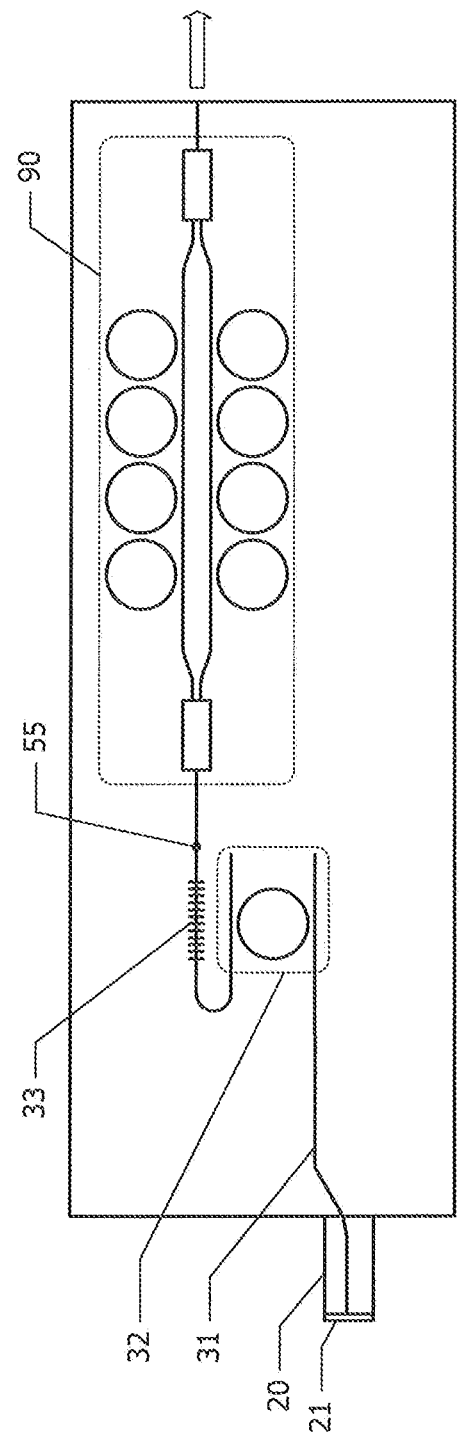
FIG. 10 is a plan view of the semiconductor optical element in the reference.

Before describing embodiments, the reference devised by the applicant of the present application is described using FIG. 10.

FIG. 10 is a plan view of the semiconductor optical element in the reference. The light output from the outgoing terminal face of the semiconductor optical amplifier 20 is input to an input-side optical waveguide 31 formed on the silicon substrate. The input-side optical waveguide 31 is connected to the input port of an add-drop ring resonator 32. To the drop port of the ring resonator 32, a distributed Bragg reflector 33 is connected. On the terminal face opposite the outgoing terminal of the semiconductor optical amplifier 20, a high-reflective film 21 is formed. The high-reflective film 21 and the distributed Bragg reflector 33 constitute a Fabry-Perot optical resonator. The high-reflective film 21, semiconductor optical amplifier 20, ring resonator 32, and distributed Bragg reflector 33 constitute an external resonator-type semiconductor laser device. When the gain of the semiconductor optical amplifier 20 becomes larger than the loss of the optical resonator, laser oscillation takes place.

The peaks of the transmission spectrum of the ring resonator 32 appear at constant wavelength intervals (free spectral range). One of those two or more peaks is selected by the distributed Bragg reflector 33. Laser oscillation occurs at the wavelength corresponding to the selected peak.

Part of the laser beam traveling back and forth inside the optical resonator enters the second-stage ring-assisted light modulator 90 past the distributed Bragg reflector 33. The ring-assisted light modulator 90 contains a Mach-Zehnder interferometer and rows of ring resonators connected to the two arms thereof. The ring-assisted light modulator 90 provides high modulation efficiency compared to an ordinary light-modulator that changes the refractive indices of the arms of a Mach-Zehnder interferometer. On the down side, it has a very narrow operating wavelength band for modulation (e.g. around 1 nm). For this reason, a light source used in combination with a ring-assisted light modulator 90 requires strict wavelength control.

In the reference illustrated in FIG. 10, the ring resonator 32 inside the optical resonator and each ring resonator inside the ring-assisted light modulator 90 have the same circumferential length. If the temperature of the silicon substrate changes due to a change in the ambient temperature, the circumferential length of the ring resonator 32 and each ring resonator inside the ring-assisted light modulator 90 changes in the same direction. In addition, this change in circumferential length of the ring resonators also causes peak wavelength shifts in the ring resonators 32 and 90. Therefore, both the oscillation wavelength of the external resonator-type semiconductor laser device and the operation wavelength of the ring-assisted light modulator 90 shift in the same direction. As long as the temperature of the silicon substrate is more or less uniform on an in-plane basis, the circumferential length of the ring resonator 32 and each ring resonator inside the ring-assisted light modulator 90 remains more or less the same even if the substrate temperature changes. For this reason, the amount of shift in laser oscillation wavelength and the amount of shift in the operating wavelength band of the ring-assisted light modulator 90 become more or less the same. This makes it possible to maintain the laser oscillation wavelength within the operating wavelength band of the ring-assisted light modulator 90.

However, when the light output of the semiconductor optical amplifier 20 was increased by increasing its input electric current, the laser oscillation wavelength sometimes fell outside the operating wavelength band of the ring-assisted light modulator 90.

Figure 11:
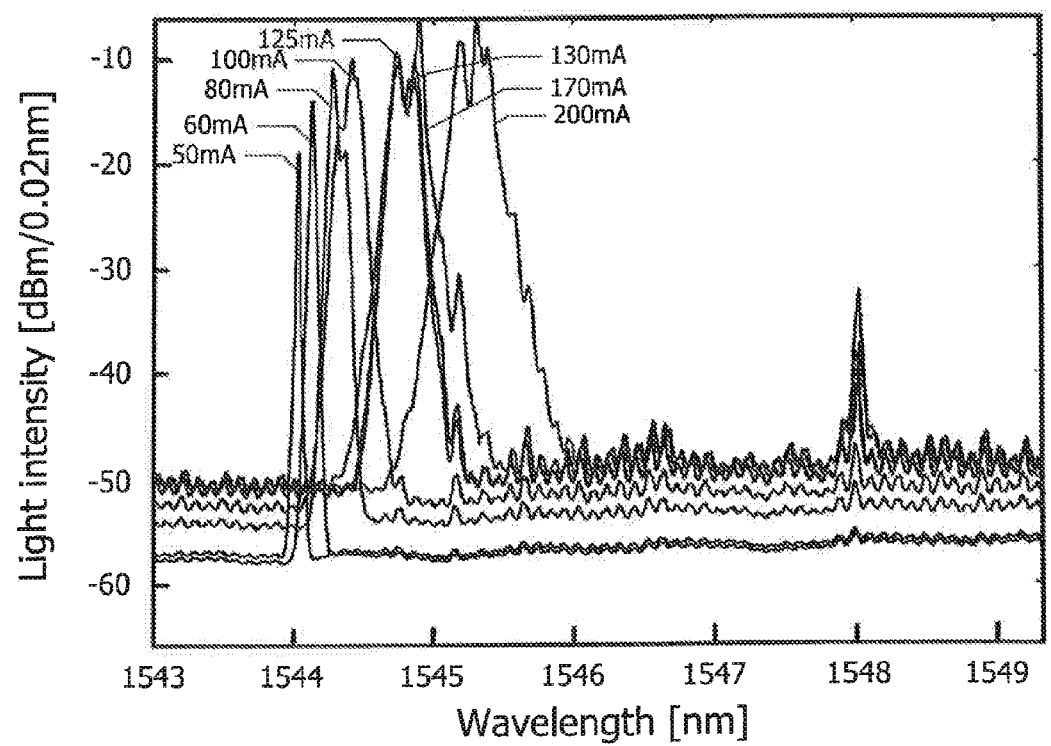
FIG. 11 is a graph showing the oscillation spectra of the external resonator-type semiconductor laser device for various input electric currents to the semiconductor optical amplifier in the reference.

FIG. 11 illustrates the spectra of the laser light that has passed through the distributed Bragg reflector 33 for various input electric currents to the semiconductor optical amplifier 20. The numerical values attached to those wave forms show the magnitude of the input electric current to the semiconductor optical amplifier 20. It can be seen that the peak wavelength of each spectrum shifts towards the longer wavelength side when input electric current is increased.

Figure 12:
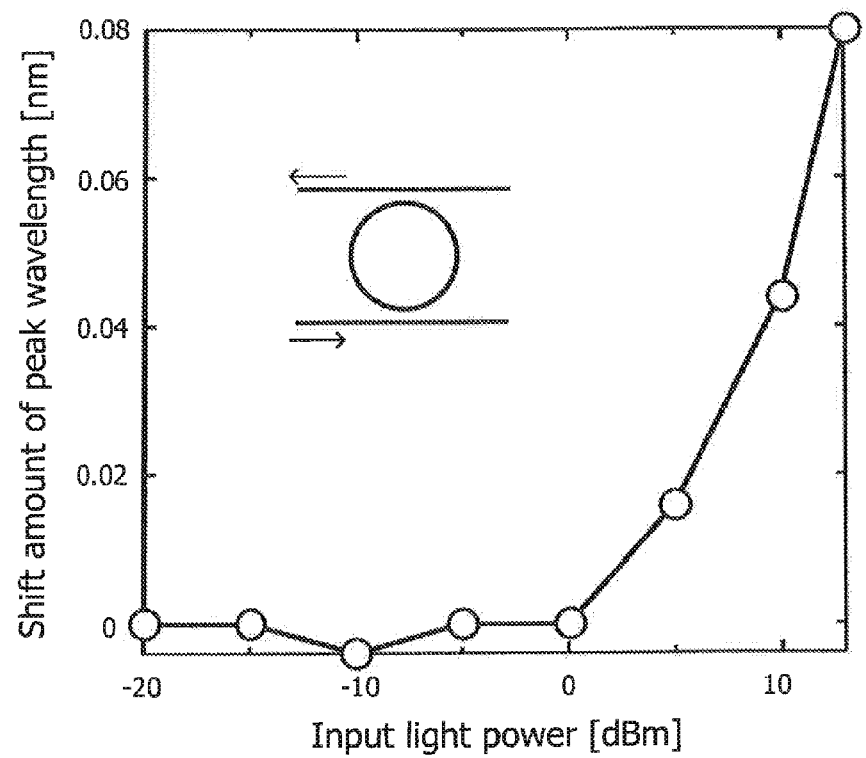
FIG. 12 is a graph showing measurement results that illustrate the relationship between the power of the input light to the add-drop ring resonator and the amount of shift in the peak wavelength in the transmission spectrum.

FIG. 12 shows measurement results that illustrate the relationship between the power of the input light to the ring resonator 32 and the size of shift in the peak wavelength in the transmission spectrum. The horizontal axis represents the power of input signal light in units of dBm, while the longitudinal axis represents the amount of shift in peak wavelength in units of nm. The peak wavelength observed when the power of input signal light is −20 dBm is defined as reference.

In the region where the power of input signal light is 0 dBm or less, peak wavelength hardly changes when the power of input signal light changes. In the region where the power of input signal light is 0 dBm or more, on the other hand, it can be seen that peak wavelength shifts towards the longer wavelength side as the power of input signal light increases. If the input electric current to the semiconductor optical amplifier 20 increases, the power of the signal light input to the ring resonator 32 also increases. If signal light power increases, the peak wavelength of the transmission spectrum of the ring resonator 32 shifts towards the longer side as illustrated in FIG. 11. This is believed to be the reason why the laser oscillation wavelength shifts towards the longer wavelength side.

An investigation is made into the reason why the peak wavelength of the transmission spectrum of the ring resonator 32 shifts towards the longer side below. Due to its optical electric-field enhancement nature, the ring-shaped waveguide of the ring resonator 32 carries a strong signal light compared to the adjacent silicon wire waveguide 31 or distributed Bragg reflector 33. Further, given that the cross section of the ring-shaped waveguide is a square or rectangle with a side measuring just several hundred nm or so, the ring-shaped waveguide ends up confining very intense light energy.

Although the optical absorption coefficient of the silicon wire waveguide is very low for lights within the 1.55 μm band, some light is converted to heat energy after being absorbed in the material that makes up the optical waveguide, by means of two-photon absorption effect or optical absorption due to impurities. For this reason, the neighborhood of the ring resonator 32 experiences localized heating. As the neighborhood of the ring resonator 32 heats up, the peak wavelength of the transmission spectrum of the ring resonator shifts towards the longer wavelength side.

The temperature rise of the region of the substrate where the ring resonators inside the ring-assisted light modulator 90 are formed is considerably small compared to the temperature rise of the neighborhood of the ring resonator 32, because an intensity of the light that travels through the ring-assisted light modulator 90 is much smaller than that of the ring resonator 32. The operating wavelength band of the ring-assisted light modulator 90 therefore barely changes. Since the oscillation wavelength of the external resonator-type semiconductor laser device shifts, whereas the operating wavelength band of the ring-assisted light modulator 90 barely changes, the oscillation wavelength falls outside the operating wavelength band oft height modulator, making stable modulation operation impossible.

Embodiment 1

FIG. 1 is a plan view of the semiconductor optical element in Embodiment 1. The semiconductor optical element in Embodiment 1 contains a semiconductor optical amplifier 20 and an optical circuit formed on a substrate 60. The semiconductor optical amplifier 20 has a maximum gain in, for instance, the 1.55 μm wavelength band.

The structure of the semiconductor optical amplifier 20 is described below. The semiconductor optical amplifier 20 contains an undoped InGaAsP active layer with a multiple quantum well structure and an n-type InP lower clad layer and p-type InP upper clad layer arranged in such a manner as to sandwich the active layer from above and below, respectively. An n-type InP semiconductor is used for the substrate. The active layer may, for instance, be 100 nm thick with a photoluminescence wavelength of 1.55 μm.

The lower clad layer, active layer and upper clad layer are said to form a striped mesa structure. Both sides of the mesa structure are embedded with a Fe-doped high-resistance InP semiconductor. The mesa structure may, for instance, be 1.5 μm wide, and the length of the element (distance from one terminal face to the other terminal face) is about 1000 μm. The lower clad layer, active layer and upper clad layer as arranged in a mesa structure provide an optical waveguide 22. On the bottom face and top face of the semiconductor optical amplifier 20, electrodes for electric current injection are formed. Each electrode may, for instance, have a triple-layer structure formed by laminating a Ti film, Pt film and Au film in that order.

On one terminal face of the semiconductor optical amplifier 20 (high-reflective terminal face), a high-reflective film 21 is formed. The other terminal face has been rendered non-reflective through non-reflective coating. The optical waveguide 22, which features a curved section, intersects perpendicularly with the high-reflective terminal face and obliquely with the non-reflective terminal face by 7° as measured from the normal line. By making the optical waveguide 22 oblique to the terminal face, reflectance can be reduced. The optical waveguide 22 has a tapered shape whereby it becomes narrower towards the terminal face.

The light output from the non-reflective terminal face of the semiconductor optical amplifier 20 is input to an input-side optical waveguide 31 formed on the substrate 60. The optical waveguide 22 inside the semiconductor optical amplifier 20 and the input-side optical waveguide 31 are joined through a butt joint structure. The joint has been sealed with a resin for refractive index adjustment. The input-side optical waveguide 31 is oblique to the edge face of the substrate 60 by 15° as measured from the normal line. The input-side optical waveguide 31 also has a tapered shape whereby it becomes narrower towards the edge face.

Figure 2A:
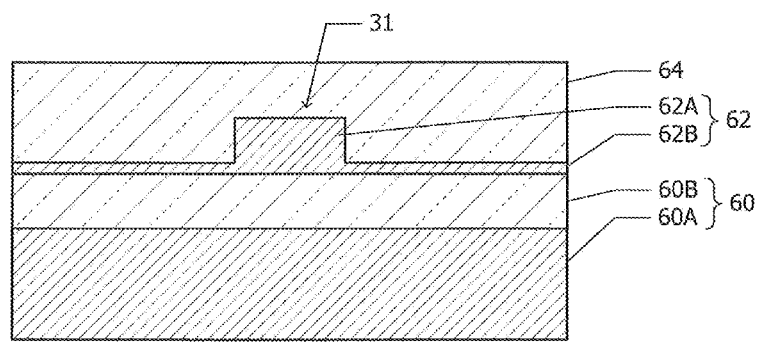

FIG. 2A is a cross-sectional view of an optical waveguide 31 on the substrate 60. Other optical waveguides also formed on the substrate 60 have an identical cross-sectional structure with the input-side optical waveguide 31. Over the silicon substrate 60A, an embedded oxide film 60B is formed to be covered with a silicon layer 62 formed over it. The silicon substrate 60A prior to the processing of the silicon layer 62, embedded oxide film 60B and silicon layer 62 can be prepared using an ordinary silicon-on-insulator (SOI) substrate production method. The thickness of the embedded oxide film 60B may, for instance, be 3 μm, and the embedded oxide film 60B acts as the lower clad layer. The thickness of the silicon layer 62 prior to processing may, for instance, be 300 nm. The silicon substrate 60A and embedded oxide film 60B constitute the substrate 60, on which optical waveguides are formed.

An optical waveguide formed on the substrate 60 has a rib waveguide structure. The core layer 62A of a rib waveguide is 300 nm high, while the silicon layer 62B, constituting the region other than the core layer 60A, is 50 nm thick. The rib waveguide structure is formed by forming a resist film over the silicon layer 62 of the SOI substrate prior to the processing and etching the silicon layer 62. The etching of the silicon layer 62 may, for instance, be achieved by adopting reactive-ion etching.

Over the silicon layer 62, a 2 μm-thick silicon oxide cover film 64 is formed. The cover film 64 acts as the upper clad layer.

The description continues by going back to FIG. 1. The input-side optical waveguide 31 is connected to the input port 41 of the optical coupler 40. As the optical coupler 40, a one-input four-output multimode interference optical coupler may, for instance, be used. The multimode interference optical coupler may, for instance, be 10 μm long.

Output ports 42A to 42D of the optical coupler 40 are connected, respectively, to input ports 51A to 51D of built-in-ring reflectors 50A to 50D via optical waveguides 43A to 43D. The optical path lengths of optical waveguides 43A to 43D are all the same Phase adjusters 45A to 45D are inserted, respectively, into optical waveguides 43A to 43D. Phase adjusters 45A to 45D are realized by forming Ti thin-film heaters on the cover film 64 (FIG. 2A). Phase adjusters 45A to 45D may, for instance, be 20 μm long.

Next, the structure of the built-in-ring reflector 50A is described. The structures of built-in-ring reflectors 50B to 50D are identical to the structure of the built-in-ring reflector 50A.

The built-in-ring reflector 50A contains an add-drop ring resonator 52A and a distributed Bragg reflector 58A. The ring resonator 52A contains a ring-shaped optical waveguide 53A and two bus waveguides 54A and 55A. The joint between one of the bus waveguide, 54A, and the ring-shaped optical waveguide 53A and the joint between the other bus waveguide, 55A, and the ring-shaped optical waveguide 53A are 180° apart in terms of the central angle. The distances that the ring-shaped optical waveguide 53A has with bus waveguide 54A and 55A at the respective joints may, for instance, be 300 nm. The radius of the ring-shaped optical waveguide 53A is 8 μm. One end of the bus waveguide 54A serves as the input port 51A of the built-in-ring reflector 50A. One end of the bus waveguide 55A acts as the drop port 56A of the ring resonator 52A.

A distributed Bragg reflector 58A is connected to the drop port 56A. The delay times for the lights input to input ports 51A to 51D of built-in-ring reflectors 50A to 50D to return to input ports 51A to 51D after being reflected from distributed Bragg reflectors 58A to 58D are ail the same. The phase shifts of the lights experienced until returning to input ports 51A to 51D are also the same. The far-side terminal of the distributed Bragg reflector 58A acts as the output port 57A of the builtin-ring reflector 50A. Other built-in-ring reflectors, 50B to 50D, are also provided with output ports 57B to 57D, respectively.

Figure 2B:
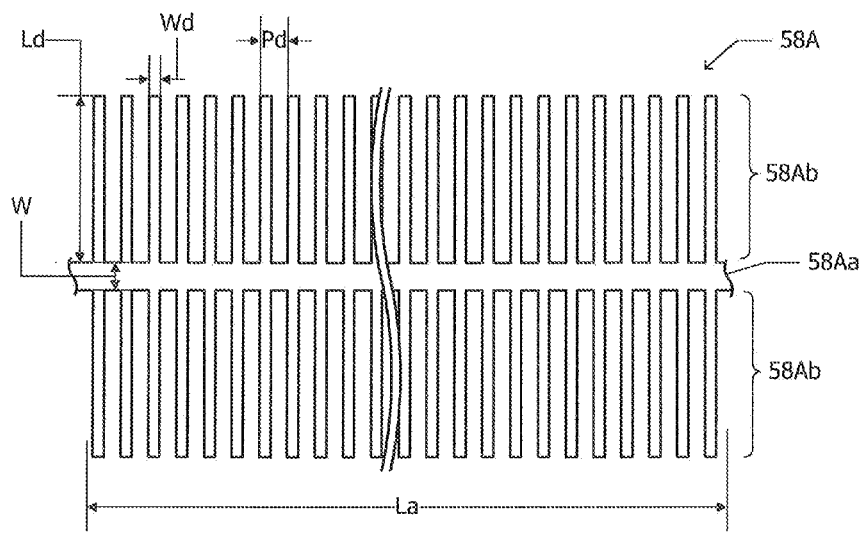
FIG. 2B is a plan view of a distributed Bragg reflector.

FIG. 2B is a plan view of the distributed Bragg reflector 58A. On either side of the constant-width optical waveguide 58Aa, a diffraction grid 58Ab is formed. The diffraction grid 58Ab comprises alternate periodical silicon regions and silicon oxide regions. Each silicon region extends from the optical waveguide 58A. The width W of the constant-width optical waveguide 58Aa is 500 nm, which is the same as the widths of other optical waveguides formed on the substrate 60. The pitch Pd of the diffraction grid 58Ab is 300 nm, while its length in the waveguiding direction La is 500 μm. The size in the waveguiding direction of each silicon region that makes up the diffraction grid 58Ab, Wd, is 30 nm to 150 nm, while its size in the direction perpendicular to the waveguiding direction, Ld, is 3 μm.

FIG. 3 is the transmission spectrum It of the ring resonator 52A and the reflection spectrum Ir of the distributed Bragg reflector 58A. The transmission spectrum It of the ring resonator 52A features two or more peaks that appear at intervals called the "free spectral range (FSR)", which is determined by the circumferential length of the ring-shaped optical waveguide 53A. The central wavelength of a reflection wavelength band of the reflection spectrum Ir of the distributed Bragg reflector 58A is determined by the pitch Pd of the diffraction grid 58Ab and the equivalent refractive index, which depends on the size of the silicon waveguide. The 3 dB range of the reflection wavelength band is determined by the coupling coefficient, which mainly depends on the size Wd of the silicon region.

The built-in-ring reflector 50A (FIG. 1) only reflects the light with the wavelength that, among the two or more peaks appearing in the transmission spectrum It of the ring resonator 52A (FIG. 1), corresponds to the peak of the reflection wavelength band in the reflection spectrum Ir of the distributed Bragg reflector 58A.

The light input to the input port 41 of the optical coupler 40 illustrated FIG. 1 is divided into equal four parts and distributed to its output ports 42A to 42D. The evenly distributed lights are then reflected by built-in-ring reflectors 50A to 50D and re-input to output ports 42A to 42D. The delay time for the light output from an output port to be re-input to the same output port is the same for all output ports 42A to 42D. The phase shifts of the light experienced until re-input to an output port are also the same for all output ports 42A to 42D. The in-phase lights re-input to output ports 42A to 42D are multiplexed by the optical coupler 40 and output to the input port 41. Any phase differences created due to manufacturing variability, etc. can be eliminated using the phase adjustors 45A to 45D. Ensuring that the lights are in phase makes it possible to reduce the loss generated during multiplexing.

Formed is a Fabry-Perot optical resonator in which each of built-in-ring reflectors 50A to 50D is one of the two opposing reflectors and the high-reflective film 21 formed in the semiconductor optical amplifier 20 is the other reflector. The semiconductor optical amplifier 20, together with the optical coupler 40 and built-in-ring reflectors 50A to 50D formed on the substrate 60, constitutes an external resonator-type semiconductor laser device. Laser oscillation occurs at the peak wavelength reflected by built-in-ring reflectors 50A to 50D. Part of the laser beam traveling back and forth in laser oscillation inside the Fabry-Perot optical resonator is output to the outside from outgoing ports 51A to 57D of built-in-ring reflectors 50A to 50D.

The energy of the light traveling along the ring-shaped optical waveguide 53A of the built-in-ring reflector 50A is about a quarter of the energy of the light traveling along the ring-shaped optical waveguide of the ring resonator 32 as part of the external resonator-type semiconductor laser device in the reference as illustrated in FIG. 10. This also applies to the ring-shaped optical waveguides inside all other built-in-ring reflectors, 50B to 50D. This makes it possible to limit heat generation from ring-shaped optical waveguides 53A to 53D. This, in turn, ensures that the amount of shift in laser oscillation wavelength toward the longer wavelength side is limited even if the input electric current to the semiconductor optical amplifier 20 is increased.

Although four built-in-ring reflectors, 50A to 50D, were employed in Embodiment 1, the number of built-in-ring reflectors is not limited to four. The number of built-in-ring reflectors may just be two or more. It suffices to make the number of output ports of the optical coupler 40 agree with the number of built-in-ring reflectors.

FIG. 4 shows measurement results illustrating the relationship between the amount of shift in the oscillation wavelength of the external resonator-type semiconductor laser device and the input electric current to the optical amplifier 20 in Embodiment 1 as illustrated in FIG. 1 and the reference as illustrated in FIG. 10. The external resonator-type semiconductor laser device used for measurement in Embodiment 1 contained four built-in-ring reflectors. The horizontal axis of FIG. 4 represents the input electric current to the semiconductor optical amplifier 20 in units of mA, while its longitudinal axis represents the amount of shift in oscillation wavelength in units of nm from the oscillation wavelength at an input electric current of 40 mA as reference.

It can be seen that the amount of shift in oscillation wavelength of the external resonator-type semiconductor laser device in Embodiment 1 was smaller than the size of shift in oscillation wavelength of the external resonator-type semiconductor laser device in the reference. The width of the operating wavelength band of the ring-assisted light modulator combined with the external resonator-type semiconductor laser device was about 0.5 nm. With the external resonator-type semiconductor laser device used in the reference, the oscillation wavelength falls outside the operating wavelength band when input electric current is 120 mA or more. In contrast, the external resonator-type semiconductor laser device in Embodiment 1 keeps the oscillation wavelength within the operating wavelength band of the ring-assisted light modulator at least at an input electric current of 200 mA or less.

Embodiment 2

Figure 5:
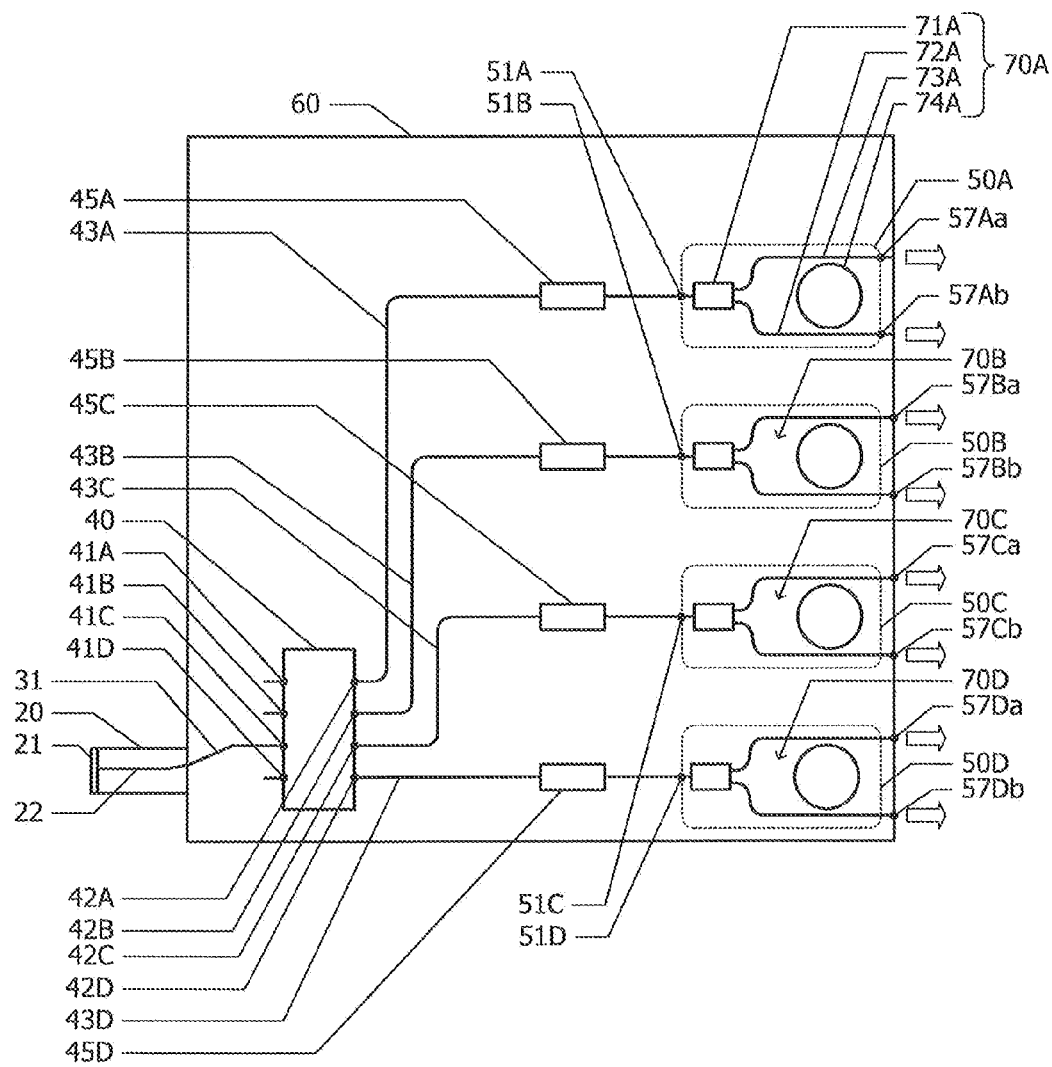
FIG. 5 is a plan view of the semiconductor optical element in Embodiment 2.
Figure 6:
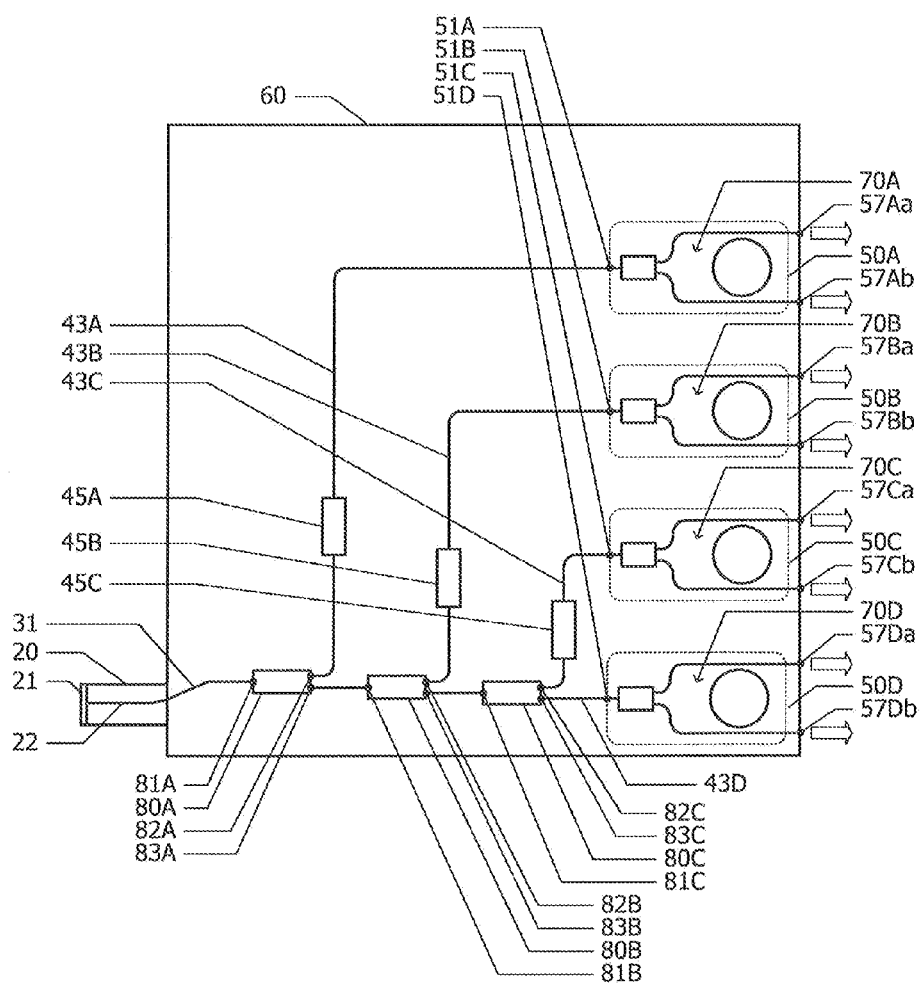
FIG. 6 is a plan view of the semiconductor optical element in Embodiment 3.

FIG. 5 is a plan view of the semiconductor optical element in Embodiment 2. In the description below, only the differences from Embodiment 1 as illustrated in FIG. 1 are addressed, with any identical aspects of the configuration omitted.

Whereas the optical coupler 40 in Embodiment 1 was a one-input four-output multimode interference optical coupler, the optical coupler 40 in Embodiment 2 is a four-input four-output multimode interference optical coupler. The optical coupler 40 therefore has four input ports, 41A to 41D, and four output ports, 42A to 42D. The length of the optical coupler 40 may, for instance, be 40 μm. The input-side optical waveguide 31 is connected to one of the input ports, 41, of the optical coupler 40.

In Embodiment 2, loop-type ring resonators 70A to 70D have been adopted as built-in-ring reflectors 50A to 50D in Embodiment 1. Loop-type ring resonators 70A to 70D are identically configured. The configuration of the loop-type ring resonator 70A is described below.

The loop-type ring resonator 70A contains an optical multiplexer-demultiplexer 71A, bus waveguides 72A and 73A and a ring-shaped optical waveguide 74A. The input port 51A of the built-in-ring reflector 50A is connected to the input port of the optical multiplexer-demultiplexer 71A. The light input to the optical multiplexer-demultiplexer 71A is divided and distributed into two output ports. Bus waveguides 72A and 73A are connected to the two output ports. Bus waveguide 72A and 73A are connected to the ring-shaped optical waveguide 74A at connection points sat on the opposite sides of the center.

The light output to one of the output ports of the optical multiplexer-demultiplexer 71A travels along the bus waveguide on the corresponding side, the ring-shaped waveguide 74A and the bus waveguide on the other side and returns to the optical multiplexer-demultiplexer 71A from the other output port. The light that has entered the output port undergoes multiplexing inside the optical multiplexer-demultiplexer 71A and output from the input port 51A. As the optical multiplexer-demultiplexer 71A, a one-input two-output multimode interference optical coupler is used.

Output ports 42A to 42B of the optical coupler 40 are, respectively, connected to input ports 51A to 51D of built-in-ring reflectors 50A to 50D via optical waveguides 43A to 43D. Similar to Embodiment 1, a Fabry-Perot optical resonator is formed, from the high-reflective film 21 of the semiconductor optical amplifier 20 and the group of built-in-ring reflectors, 50A to 50D, as a pair of reflectors. Phase adjusters 45A to 45D have been inserted into optical waveguides 43A to 43D, respectively.

Although the optical path lengths of optical waveguides 43A to 43D were the same in Embodiment 1, they are different in Embodiment 2. The optical coupler 40, optical waveguides 43A to 43D and built-in-ring reflectors 50A to 50D constitute a folded arrayed-waveguide grating.

The optical path lengths of optical waveguides 43A, 43B, 43C and 43D are set to progressively increase by $\Delta L$ in that order. Namely, when the optical path length of the optical waveguide 43D is L, the optical path lengths of optical waveguides 43C, 43B and 43A are $L+\Delta L$, $L+2\Delta L$ and $L+3\Delta L$, respectively. Here, the incremental step in optical path length $\Delta L$ constitutes a parameter that determines the FSR of the folded arrayed-waveguide grating. For instance, $\Delta L$ is set to be equal to the circumferential length of the ring-shaped optical waveguide 74A to 74D divided by 2N, where N is the number of array waveguides. In this case, signal lights corresponding to adjacent peaks of the reflection spectrum of the built-in-ring reflector 50A to 50D enter different input ports. In specific terms, since the radius of the ring-shaped optical waveguide 74A is 8 μm in Embodiment 2 and N=4, the incremental step in optical path length $\Delta L$ is about 6.25 μm.

The reflection spectrum of built-in-ring reflectors 50A to 50D has two or more peaks spaced at the free spectral range. By adjusting the phase adjusters 45A to 45D, a multiplexted light containing only the wavelength component corresponding to a selected peak of all wavelength components of the lights that have returned to output ports 42A to 42D of the optical coupler 40 after being reflected from built-in-ring reflectors 50A to 50D can be obtained at the input port 41C. Multiplexted lights of wavelength components corresponding to other peaks end up at other input ports, 41A, 41B and 41D, or no input port at all. For instance, when the phase delay of the phase adjusters 45B and 45D is 0 (reference), the phase delay of the phase adjusters 45A and 45C is $\pi/2$ (90°).

Thus, the folded arrayed-waveguide grating acts as an optical filter that selects one peak from the two or more peaks featuring in the reflection spectrum of built-in-ring reflectors 50A to 50D. For this reason, distributed Bragg reflectors as used in Embodiment 1 are not needed in Embodiment 2.

Embodiment 2 is also capable of limiting the amount of shift in laser oscillation wavelength when input electric current is increased since the energy of the light output from the semiconductor optical amplifier 20 is divided into four and distributed to loop-type ring resonators 70A to 70D.

In Embodiment 2, the far-side terminals of the two bus waveguides of all of loop-type ring resonators 70A to 70D constitute output ports 57Aa, 57Ab, 57Ba, 57Bb, 57Ca, 57Cb, 57Da and 57Db of the external resonator-type semiconductor laser device.

Again in Embodiment 2, the number of built-in-ring reflectors does not need to be four as long as it is two or more. It then suffices to make the number of input ports of the optical coupler 40 and number of its output ports agree with the number of built-in-ring reflectors.

Embodiment 3

FIG. 5 is a plan view of the semiconductor optical element in Embodiment 3. In the description below, only the differences from Embodiment 1 as illustrated in FIG. 1 are addressed, with any identical aspects of the configuration omitted.

In Embodiment 2, the light traveling along the input-side optical waveguide 31 is divided and distributed to two or more optical waveguides (four in the case of FIG. 5, 43A to 43D) by a single optical coupler 40. In Embodiment 3, on the other hand, the light traveling along the input-side optical waveguide 31 is divided and distributed to two or more optical waveguides, 43A to 43D, by two or more cascade-connected optical couplers (three in the case of FIG. 6, 80A to 80C). As optical couplers 80A to 80C, one-input two-output multimode interference couplers or directional couplers may, for instance, be used. If directional couplers are used, the coupling length of a directional coupler is 40 μm, while the width of an optical waveguide is 300 nm.

The input-side optical waveguide 31 is connected to the input port 81A of the first-stage optical coupler 80A. An optical waveguide 43A is connected to one of the output ports, 82A, of the optical coupler 80A, while the input port 81B of the next-stage optical coupler 80B is connected to the other output port (coupling port), 83A. Similarly, an optical waveguide 43B is connected to output port 82B of the second-stage optical coupler 80B, while the input port 81C of the next-stage optical coupler 80C is connected to the coupling port 83B. An optical waveguide 43C is connected to output port 82C of the final-stage optical coupler 80C, while an optical waveguide 43D is connected to coupling port 83C.

The optical path lengths of optical waveguides 43A, 43B, 43C and 43D are set to progressively increase by $\Delta L$ in that order. Namely, when the optical path length of optical waveguide 43D is L, the optical path lengths of optical waveguides 43C, 43B and 43A are $L+\Delta L+2\Delta L$ and $L+3\Delta L$, respectively. The incremental step in optical path length $\Delta L$ may, for instance, be 2.5 μm.

A phase adjust or is not inserted into the shortest optical waveguide, 43D. Phase adjusters 45A to 45C, inserted into the other optical waveguides, 43A to 43C, are used for fine phase adjustments. If there is no need to provide fine adjustments, phase adjusters 45A to 45C are not necessary.

Optical couplers 80A to 80C, optical waveguides 43A to 43D and built-in-ring reflectors 50A to 50D act as a folded asymmetric Mach-Zehnder interference optical filter.

Figure 7:
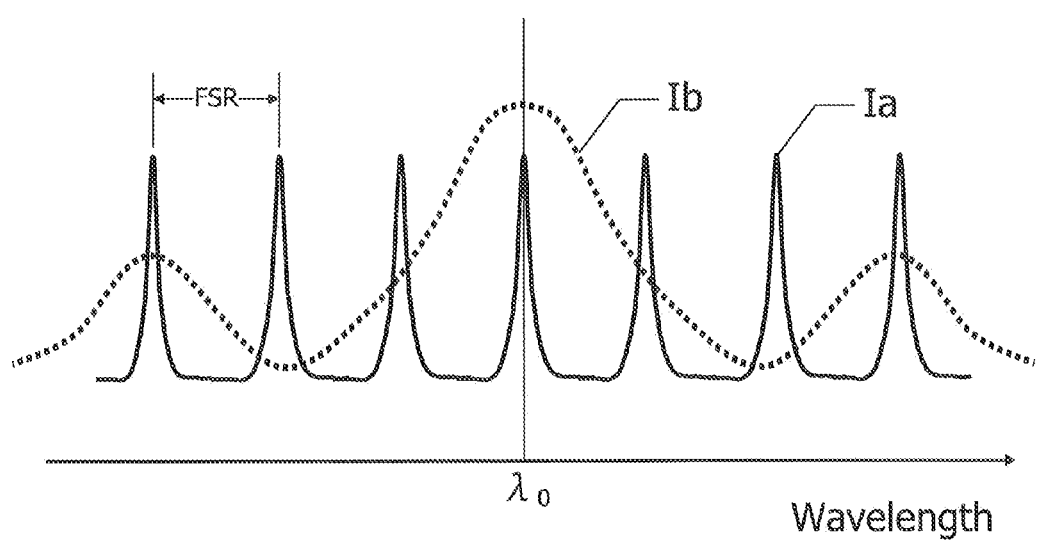
FIG. 7 is a graph showing the reflection spectrum of the built-in-ring reflector and the transmission spectrum of the folded asymmetric Mach-Zehnder interference optical filter in Embodiment 3.

FIG. 7 shows the reflection spectrum Ia of loop-type ring resonators 70A to 70D and the transmission spectrum Ib of the asymmetric Mach-Zehnder interference optical filter. The reflection spectrum Ia of loop-type ring resonators 70A to 70D has two or more peaks at FSR intervals. The transmission spectrum Ib of the asymmetric Mach-Zehnder interference optical filter has the maximum at wavelength λ0, which corresponds to one of the two or more peaks of the reflection spectrum Ia, and exhibits characteristics wherein wavelengths corresponding to adjoining peaks are not contained in the 3 dB range. Of the two or more peaks featuring in the reflection spectrum Ia, one is selected by the asymmetric Mach-Zehnder interference optical filter.

Although the energy of the light output from the semiconductor optical amplifier 20 is not divided and distributed to loop-type ring resonators 70A to 70D in four equal parts in Embodiment 3, the light energy introduced to each of loop-type ring resonators 70A to 70D is smaller than the light energy introduced to the ring resonator 32 in the reference illustrated in FIG. 10. For this reason, the amount of shift in laser oscillation wavelength when input electric current is increased can be limited.

Embodiment 4

Figure 8:
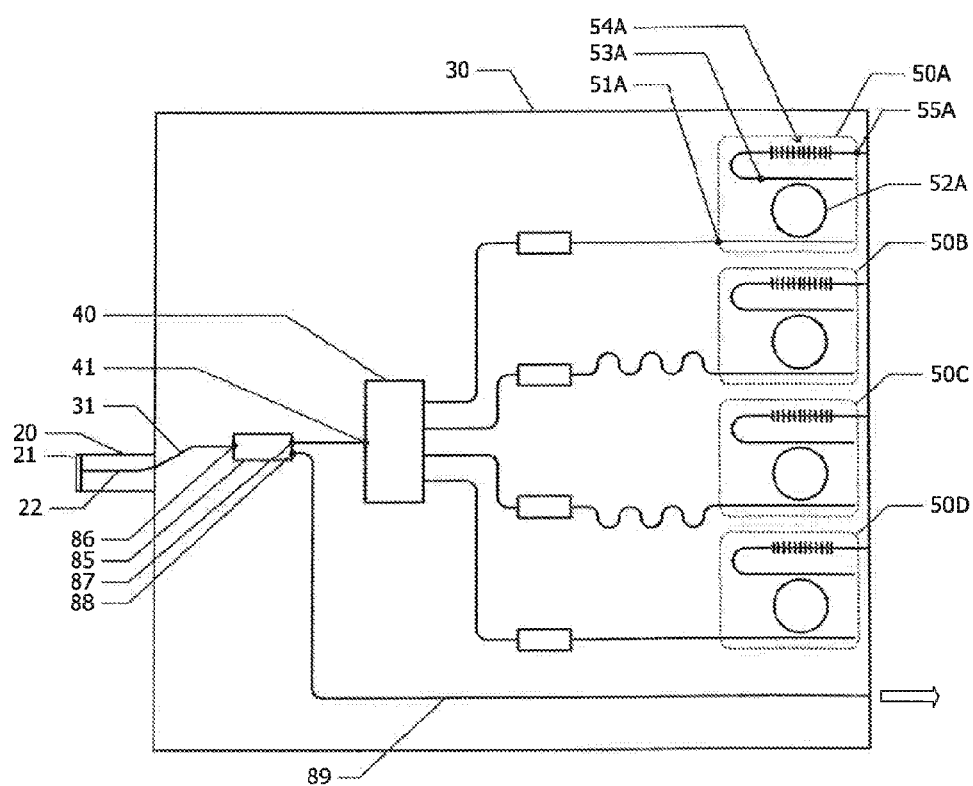
FIG. 8 is a plan view of the semiconductor optical element in Embodiment 4.

FIG. 8 is a plan view of the semiconductor optical element in Embodiment 4. In the description below, only the differences from Embodiment 1 as illustrated in FIG. 1 are addressed, with any identical aspects of the configuration omitted.

In Embodiment 1, the input-side optical waveguide 31 was directly connected to the input port 41 of the optical coupler 40. In Embodiment 4, the input-side optical waveguide 31 is connected to the input port 86 of the optical splitter 85. Output port 87 of the optical splitter 85 is connected to the input port 41 of the optical coupler 40. An output optical waveguide 89 is connected to the coupling port 88 of the optical splitter 85. As the optical splitter 85, a directional coupler may, for instance, be used.

Part of the light that travels along the input-side optical waveguide 31 after being output from the semiconductor optical amplifier 20 is led to the coupling port 88 and taken outside via an output optical waveguide 89. While, in Embodiments 1 to 3, the output of the semiconductor optical amplifier 20 was always divided and distributed to two or more output ports before being taken outside, part of this output is taken outside via the optical waveguide 89 in Embodiment 4. This allows a strong signal light to be obtained.

It is possible to also apply the configuration based on an optical splitter 85 and output optical waveguide 89 to Embodiments 2 and 3.

Embodiment 5

Figure 9:
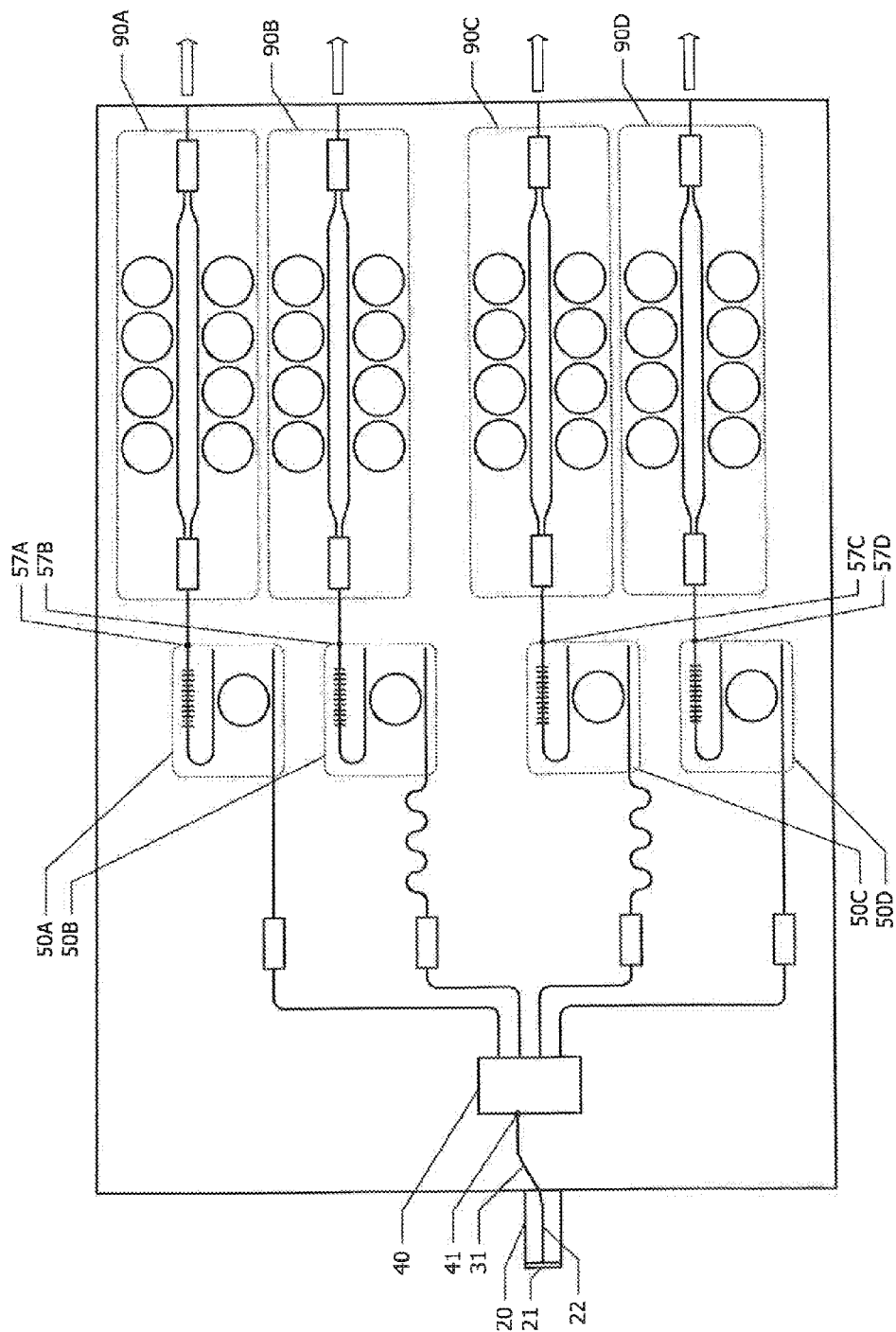
FIG. 9 is a plan view of the semiconductor optical element in Embodiment 5.

FIG. 9 is a plan view of the semiconductor optical element in Embodiment 5. In the description below, only the differences from Embodiment 1 as illustrated in FIG. 1 are addressed, with any identical aspects of the configuration omitted.

Ring-assisted light modulators 90A to 90D are connected to the four output ports, 57A to 57D, of the external resonator-type semiconductor laser device in Embodiment 1, respectively. Each of ring-assisted light modulators 90A to 90D has a Mach-Zehnder interferometer and two rows of ring resonators connected to its two arms. Ring-assisted light modulators 90A to 90D have been formed on the same substrate 60 as built-in-ring reflectors 50A to 50D and so on.

The circumferential length of a ring resonator featuring in ring-assisted light modulators 90A to 90D is the same as the circumferential length of a ring resonator featuring in built-in-ring reflectors 50A to 50D. This makes it easy to keep the oscillation wavelength of the external resonator-type semiconductor laser device within the operating wavelength band of the ring-assisted light modulator. It also makes it possible to prevent the laser oscillation wavelength from falling outside the operating wavelength band of ring-assisted light modulators 90A to 90D as it can limit the amount of shift in laser oscillation wavelength when the input electric current to the semiconductor optical amplifier 20 increases in a similar manner as Embodiment 1.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions, and alterations could be made hereto without departing from the spirit and scope of the invention.

The invention claimed is:

1. A semiconductor optical element comprising;
an optical amplifier;
a plurality of first reflectors, formed on a substrate, that reflect lights input from their respective input ports, return them to the input ports, and exhibit a reflection spectrum featuring a peak at a target wavelength;
a first optical coupler, formed on the substrate, that divides light output from the optical amplifier and inputs the divided lights to the input ports of the plurality of first reflectors, combines the lights reflected from the plurality of first reflectors, and re-inputs them to the optical amplifier; and
a second reflector that, together with each of the first reflectors, defines an optical resonator containing the optical amplifier and optical coupler;
wherein each of the first reflectors contains a ring resonator of the same size and the delay time for the light input from the input port to return there after being reflected is the same for all first reflectors.

2. The semiconductor optical element as described in claim 1, wherein:
the first optical coupler is a multimode interference optical coupler having one input port and a plurality of output ports; and
the optical path length of the optical waveguide from an output port of the first optical coupler to the input port of the first reflector connected to this output port is the same for all first reflectors.

3. The semiconductor optical element as described in claim 2, wherein each of the first reflectors comprises:
an add-drop ring resonator to which the light input to the input port of the first reflector is input; and
a distributed Bragg reflector connected to the drop port of the ring resonator.

4. The semiconductor optical element as described in claim 1, wherein:

the first optical coupler is a multimode interference optical coupler having the same number of input ports and the same number of output ports as the first reflectors;

the light output from the optical amplifier is input to one of the input ports of the first optical coupler;

the output ports of the first optical coupler are connected to the input ports of the first reflectors;

the optical path length of the optical waveguide from an output port of the first optical coupler to the input port of the corresponding first reflector varies from one first reflector to another; and the first optical coupler and the plurality of first reflectors act as a folded arrayed-waveguide grating.

5. The semiconductor optical element as described in claim 4 wherein each of the first reflectors comprises a loop-type ring resonator.

6. The semiconductor optical element described in claim 1, wherein:

the first optical coupler comprises a plurality of cascade-connected optical couplers;

the output light from the optical amplifier is input to the input port of the first-stage optical coupler;

the coupling port of each cascaded-connected optical coupler is connected to the input port of the next-stage optical coupler;

the output port of each cascaded-connected optical coupler is connected to the input port of one of the first reflectors;

the coupling port of the last-stage optical coupler is connected to the input port of one of the first reflectors;

the optical path length of the optical waveguide from the output port of each cascaded-connected optical coupler to the input port of the first reflector connected to this output port vary from one first reflector to another, and the optical path length of the optical waveguide from the coupling port of the last-stage optical coupler to the input port of the first reflector connected thereto differ from the optical path length of each optical waveguide from the output port of a cascaded-connected optical coupler to the input port of the corresponding first reflector; and the first optical coupler and the first reflectors act as a folded asymmetric Mach-Zehnder interference optical filter.

7. The semiconductor optical element as described in claim 6 wherein each of the first reflectors comprises a loop-type ring resonator.

8. The semiconductor optical element described in claim 1, further comprising:

an output optical waveguide formed on the substrate; and a second optical coupler formed on the substrate to branch off part of the light traveling to the first optical coupler after being output from the optical amplifier to the output optical waveguide.

9. The semiconductor optical element described in claim 1, further comprising a light modulator including ring-shaped optical waveguides that is disposed on the substrate to receive lights taken out from the resonators and achieves synchronization with the resonant wavelength of the ring resonators in the first reflectors.

* * * * *